United States Patent
Mizuhashi et al.

(10) Patent No.: US 8,816,733 B2
(45) Date of Patent: Aug. 26, 2014

(54) DELAY LOCKED-LOOP CIRCUIT AND DISPLAY APPARATUS

(75) Inventors: Hiroshi Mizuhashi, Kanagawa (JP); Michiru Senda, Kanagawa (JP); Gen Koide, Shiga (JP)

(73) Assignee: Japan Display West Inc., Aichi-Ken (JP)

( * ) Notice: Subject to any disclaimer, the term of this patent is extended or adjusted under 35 U.S.C. 154(b) by 929 days.

(21) Appl. No.: 12/379,727

(22) Filed: Feb. 27, 2009

(65) Prior Publication Data

US 2009/0243678 A1 Oct. 1, 2009

(30) Foreign Application Priority Data

Mar. 28, 2008 (JP) ................................. 2008-085665

(51) Int. Cl.
*H03L 7/06* (2006.01)
*H03L 7/081* (2006.01)
*H03L 7/093* (2006.01)

(52) U.S. Cl.
CPC .............. *H03L 7/0814* (2013.01); *H03L 7/093* (2013.01)
USPC .......................................... 327/158; 327/156

(58) Field of Classification Search
USPC .................................................. 327/156, 158
See application file for complete search history.

(56) References Cited

U.S. PATENT DOCUMENTS

| 7,253,668 B2 * | 8/2007 | Johnson ........................ 327/158 |
| 2004/0252569 A1 | 12/2004 | Watanabe |
| 2008/0136475 A1 * | 6/2008 | Gomm et al. ................. 327/158 |

FOREIGN PATENT DOCUMENTS

| JP | 08-097715 A | 4/1996 |
| JP | 08-237091 A | 9/1996 |
| JP | 10-079663 A | 3/1998 |
| JP | 11-015555 A | 1/1999 |
| JP | 2002-152038 A | 5/2002 |
| JP | 2005-006146 | 1/2005 |
| JP | 2005-038557 A | 2/2005 |

OTHER PUBLICATIONS

Japanese Office Action issued Dec. 22, 2009 for corresponding Japanese Application No. 2008-085665.

Japanese Office Action issued Mar. 30, 2010 for corresponding Japanese Application No. 2008-085665.

\* cited by examiner

*Primary Examiner* — Lincoln Donovan
*Assistant Examiner* — Diana J Cheng
(74) *Attorney, Agent, or Firm* — Rader, Fishman & Grauer PLLC

(57) ABSTRACT

A delay locked-loop circuit includes: a phase comparator detecting a phase difference between an external clock and an internal clock; an up/down counter controlling a delay time in accordance with an output signal from the phase comparator; and a delay line including plural unit delay circuits corresponding to plural bits of a signal output from the up/down counter in order to control the delay of the external clock to conform the external clock to the internal clock, and in which the unit delay circuits controlled by the output from a same bit in the output from the up/down counter are not connected adjacently to each other in the connection of the plural unit delay circuits in series.

5 Claims, 9 Drawing Sheets

ENLARGED CONFIGURATION DIAGRAM

BACKGROUND OF THE INVENTION

BACKGROUND OF THE INVENTION

BACKGROUND OF THE INVENTION

DELAY LOCKED-LOOP CIRCUIT AND DISPLAY APPARATUS

CROSS REFERENCES TO RELATED APPLICATIONS

The present invention contains subject matter related to Japanese Patent Application JP 2008-085665 filed in the Japanese Patent Office on Mar. 28, 2008, the entire contents of which being incorporated herein by reference.

BACKGROUND OF THE INVENTION

1. Field of the Invention

The present invention relates to a delay locked-loop circuit that keeps the synchronization between an external clock and an internal clock and a display apparatus employing the same.

2. Description of the Related Art

A clock generator applied in a clock synchronization system is an indispensable component circuit for keeping the synchronization between external data (such as an external clock) and an internal clock, as represented by a delay locked-loop circuit (which will be called "DLL" hereinafter). Even among the circuits included in the DLL, a delay control line that adjusts a phase shift is an important part for determining the maximum operating frequency or output jitter of the DLL (refer to JP-A-2005-006146 (Patent Document 1), for example).

FIG. 8 is a block diagram illustrating a DLL in the digital system as an example of the clock generator. The digital system is superior to the analog system from the viewpoint of the lower voltage operation and lower jitter and has been studied and developed actively in recent years. The DLL includes a phase comparator 1 that detects the phase difference between an external clock and an internal clock, an up/down counter (which will be called "counter" hereinafter) 2 that controls the delay time with output signals UP and DN from the phase comparator 1, a digital control delay line 3 that adjusts the delay time, and a clock driver 4.

In this embodiment, the counter has 4 bits, and 15 unit delay circuits (which will be called "Delay-Cells" hereinafter) are included in the digital control delay line. One, two, four and eight Delay-Cells connect to the LSB, 2nd bit, 3rd bit and MSB of a counter output signal, respectively.

FIG. 9 is a circuit diagram showing an example of the Delay-Cell included in the digital control delay line. The Delay-Cell includes inverters INV1, INV2 and INV3, switches SW1 and SW2 and capacitances C1 and C2.

The Delay-Cell switches the connection between the capacitances C1 and C2 and the delay line in accordance with the level of an n bit of the output signal from the counter 2 to implement the adjustment of the amount of delay.

FIG. 10 is a timing chart for a digital DLL. With reference to FIG. 10, the operational principle of the phase adjustment will be described. When an internal clock $CLK_{INT}$ lags behind an external clock $CLK_{EXT}$ (in the period 1), the signal DN has an "H" level, which is counted down by the counter 2. This separates the capacitances (C1 and C2 in FIG. 9) for delay adjustment one after another from the delay line and thus reduces the phase difference between the internal clocks $CLK_{INT}$ and the external clocks $CLK_{EXT}$.

Conversely, when the internal clock $CLK_{INT}$ passes the external clock $CLK_{EXT}$ (in the period 2), the signal UP has an "H" level, which is counted up by the counter 2. This connects the capacitances (C1 and C2 in FIG. 9) for delay adjustment one after another to the delay line and thus reduces the phase difference between the external clock $CLK_{EXT}$ and the internal clock $CLK_{INT}$.

SUMMARY OF THE INVENTION

The digital DLL in the configuration, however, has problems in a series of operations as follows. That is, the change from the state that the MSB of the counter output is "0" and the other bits are all "1" to the state that the MSB is "1" and the other bits are all "0" because one delay is added may result in consecutive instable unit delay circuits. For example, in a case with counter outputs of 4 bits and when the counter output changes from "0111" to "1000" at a certain time, the preferable amount of delay to be controlled includes the addition of the delay for one Delay-Cell. However, the signal present on the digital control delay line when the counter output has the change delays more than the desirable amount of delay.

For example, the signal present in the 7th Delay-Cell from the left of FIG. 8 when the counter output changes as described above is added with the amount of delay for eight Delay-Cells and continuously has a significantly instable operation state until a signal added with the amount of delay for one desirable Delay-Cell is input to the phase comparator 1, which may possibly cause a malfunction including locking under an improper state. Furthermore, increasing the lock range (or increasing the frequency band) by keeping the configuration may require increasing the number of counter bits. Increasing the number of the counter bits to 5 bits, for example, may result in 31 Delay-Cells, and increasing the number of counter bits to 6 bits may result in 63 Delay-Cells, which significantly increases the circuit size and by which the problems become pronounced greatly.

According to an embodiment of the invention, there is provided a delay locked-loop circuit including a phase comparator detecting a phase difference between an external clock and an internal clock, an up/down counter controlling a delay time in accordance with an output signal from the phase comparator, a delay line including plural unit delay circuits corresponding to plural bits of a signal output from the up/down counter in order to control the delay of the external clock to conform the external signal to the internal clock, and in which the unit delay circuits controlled by the output from a same bit in the output from the up/down counter are not connected adjacently to each other in the connection of the plural unit delay circuits in series.

In this embodiment, the unit delay circuits controlled by the output from a same bit in the output from the up/down counter are not connected adjacently to each other in the delay line having plural unit delay circuits connected in series. Therefore, when a delay for one desirable unit delay circuit is added thereto, instable unit delay circuits are not consecutive.

According to another embodiment of the invention, there is provided a display apparatus including a display unit whose display timing is controlled by an internal clock, and a delay locked-loop circuit adapted to give the internal clock in a phase synchronized with that of an external clock to the display unit and including a phase comparator detecting a phase difference between the external clock and the internal clock, an up/down counter controlling a delay time in accordance with an output signal from the phase comparator, and a delay line including plural unit delay circuits corresponding to plural bits of a signal output from the up/down counter in order to control the delay of the external clock to conform the external clock to the internal clock and in which the unit delay circuits controlled by the output from a same bit in the output from the up/down counter are not connected adjacently to each other in the connection of the plural unit delay circuits in series.

In a case where the delay locked loop circuit for giving an internal clock in a phase synchronized with that of an external clock to the display unit includes plural unit delay circuits connected in series, the unit delay circuits controlled by the output from a same bit in the output from the up/down counter are not connected adjacently to each other. Therefore, when a delay for one desirable unit delay circuit is added thereto, instable unit delay circuits are not consecutive.

The invention can stabilize operations until a signal having an added delay for one desirable unit delay circuit is input to the phase comparator, which can prevent the occurrence of malfunctions by avoiding locking at an improper state.

DESCRIPTION OF THE PREFERRED EMBODIMENTS

With reference to drawings, embodiments of the invention will be described below.

Configuration of DLL According to First Embodiment

Figure 1:
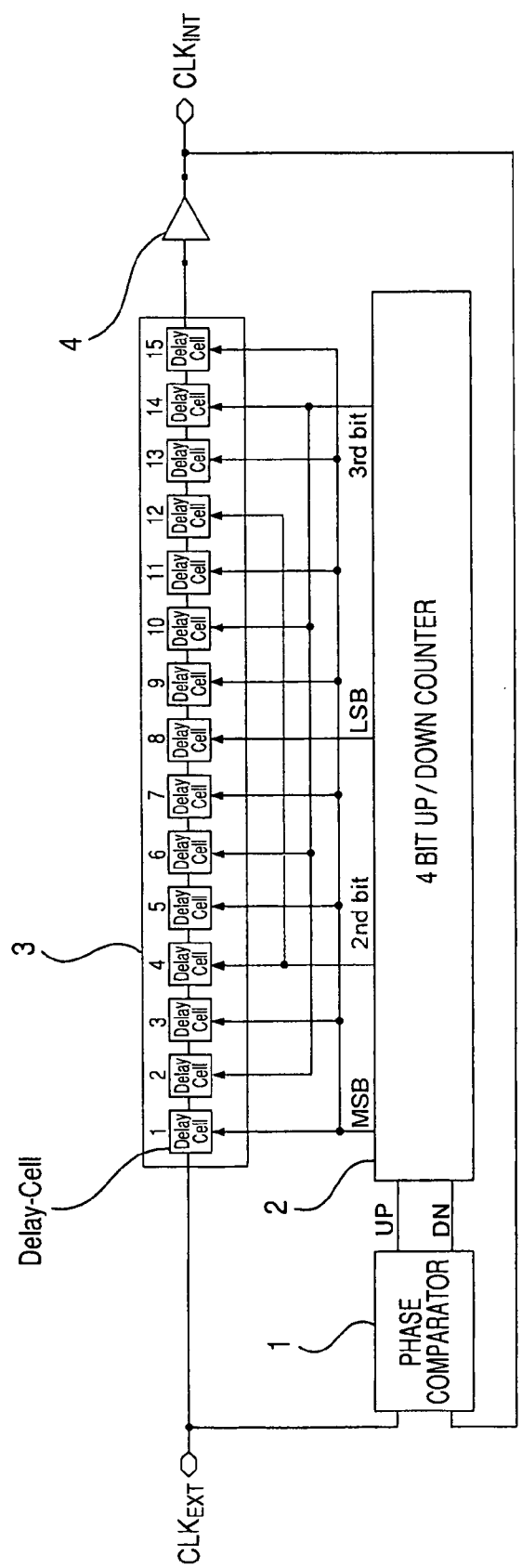
FIG. 1 is a block diagram illustrating an example of a digital DLL according to a first embodiment.

FIG. 1 is a block diagram illustrating an example of a digital DLL according to a first embodiment. The DLL according to this embodiment includes a phase comparator 1 detecting a phase difference between an external clock and an internal clock phase, a counter 2 controlling a delay time in accordance with output signals UP and DN from the comparator 1, a digital control delay line 3 adjusting a delay time, and a clock driver 4.

Figure 8:
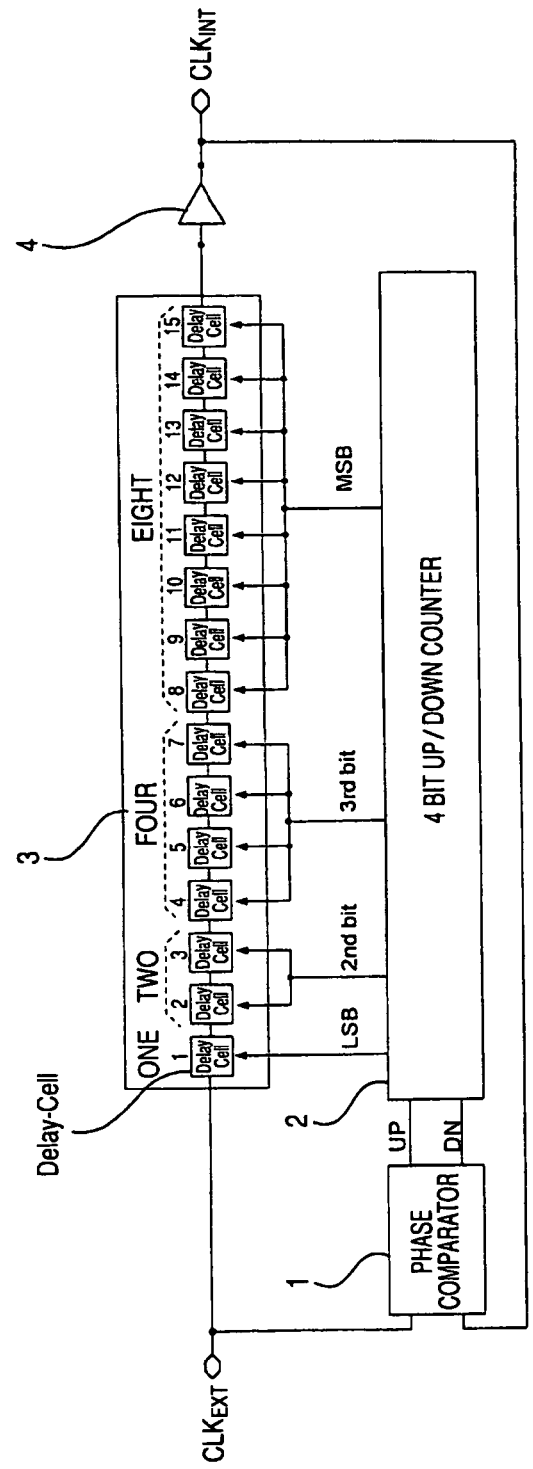
FIG. 8 is a block diagram illustrating a digital DLL as an example of a clock generator.
Figure 9:
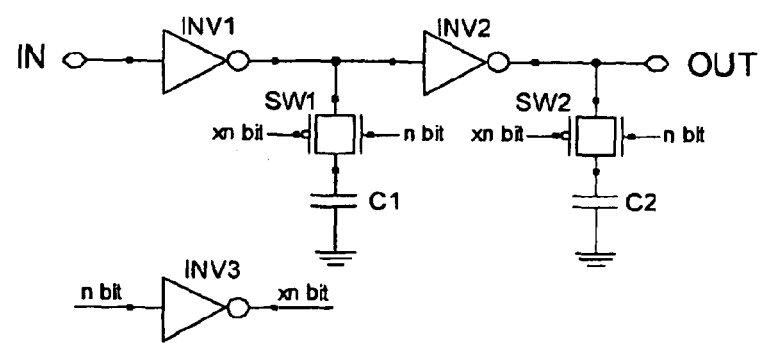
FIG. 9 is a circuit diagram showing an example of a Delay-Cell included in the digital control delay line.
Figure 10:
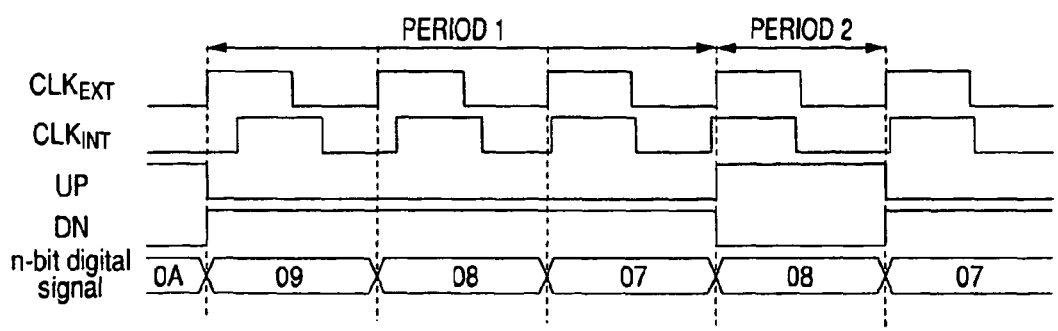
FIG. 10 is a timing chart for a digital DLL.

The DLL of this embodiment is different from the DLL in the past shown in FIG. 8 in the connection between the output signal by the counter 2 and Delay-Cells included in the digital control delay line 3. In other words, the DLL of this embodiment is different from the DLL in the past in that the Delay-Cells controlled by the output from a same bit in the output from the counter are not placed adjacently to each other in the connection of plural Delay-Cells included in the digital control delay line in series.

More specifically, plural Delay-Cells controlled by the output from the most significant bit (MSB) among plural bits output from the counter are placed at alternate positions in the serial connection of the Delay-Cells.

Furthermore, in the arrangement of the Delay-Cells at alternate positions in accordance with the MSB as described above, one Delay-Cell corresponding to the least significant bit (LSB) from the counter is placed at the center position in the alternate empty spaces excluding the alternate positions.

In the example shown in FIG. 1, because the output from the counter is 4 bits, a total of 15 Delay-Cells are connected in series correspondingly to the output lines of the bits of the counter in the digital control delay line. The amount of delay depends on the number of Delay-Cells at the ON-state among the Delay-Cells.

Among the plural bits, which are in an output signal from the 4-bit counter shown in FIG. 1, the LSB connects to the 8th Delay-Cell from the left, the 2nd bit connects to the 4th and 12th Delay-Cells, the 3rd bit connects to the 2nd, 6th, 10th and 14th Delay-Cells, and the MSB connects to the 1st, 3rd, 5th, 7th, 9th, 11th, 13th and 15th Delay-Cells.

The connection of the bit outputs from the counter 2 to the Delay-Cells included in the digital control delay line alternately, that is, in the arrangement that the Delay-Cells controlled by the output from a same bit are not adjacent to each other can eliminate the instable period as in the technology in the past.

More specifically, the connection adds an amount of delay for one Delay-Cell to the state that the MSB in the output signal (of plural bits) from the counter 2 is "0" and the other bits are all "1". When the state changes to the state that the MSB is "1" and the other bits are all "0, instable Delay-Cells are at alternate positions, which are not consecutive positions, in the serial connection. The inconsecutive instable Delay-Cells can stabilize the operation on the signals at some point in the digital control delay line 3.

For example, even when the output from the 4-bit counter changes from "0111" to "1000" at a certain time with one additional delay, for example, the amount of the shift of the signal against the amount of delay to be controlled on the digital control delay line when the counter output changes can be suppressed to the amount of delay for one Delay-Cell, which can secure a stable operation.

Now, the operation of the DLL of this embodiment will be compared with the operation in the configuration in the past. That is, like in a DLL in the past (refer to FIG. 8), the consecutive serial connection of the Delay-Cells corresponding to a same bit in plural bits in the output signal by the counter may result in the operations as follows.

For example, if the counter output is "0111", the seven Delay-Cells of the 1st to 7th ones from the left, which correspond to LSB, the 2nd bit and 3rd bit, are at the ON-state while the eight Delay-Cells of the 8th to 15th ones, which correspond to the MSB, are at the OFF-state.

With the addition of one delay from the states, when the counter output changes to "1000", the seven Delay-Cells of the 1st to 7th ones from the left, which correspond to LSB, the 2nd bit and 3rd bit are switched to the OFF-state while the eight Delay-Cells of the 8th to 15th ones, which correspond to the MSB, are switched to the ON-state.

Then, the signals having been in the seven Delay-Cells from the 1st to 7th ones until they become instable until they reach the 8th Delay-Cell. Especially, the signal in the 1st Delay-Cell may be required to pass more Delay-Cells at the OFF-state until it reaches the 8th Delay-Cell and becomes remarkably instable.

On the other hand, like in the DLL of this embodiment (refer to FIG. 1), the connection in which the Delay-Cells controlled by the output from the same bit in the output from the counter are not adjacent to each other results in the operation as follows.

For example, if the counter output is "0111", the seven Delay-Cells of the 2nd, 4th, 6th, 8th, 10th, 12th and 14th ones from the left, which correspond to the LSB, 2nd bit and 3rd bit, are at the ON-state while the eight Delay-Cells of the 1st, 3rd, 5th, 7th, 9th, 11th, 13th and 15th ones, which correspond to the MSB, are at the OFF-state.

With the addition of one delay from the states, when the counter output changes to "1000", the 2nd, 4th, 6th, 8th, 10th, 12th and 14th seven Delay-Cells, which correspond to the LSB, 2nd bit and 3rd bit are switched to the OFF-state while the 1st, 3rd, 5th, 7th, 9th, 11th, 13th and 15th eight Delay-Cells, which correspond to the MSB, are switched to the ON-state.

In the DLL of this embodiment, even when the 4-bit counter output changes from "0111" to "1000" with the addition of one delay, signals do not pass Delay-Cells at the OFF-state consecutively. Therefore, the instable state ends in a short time.

Notably, this embodiment includes the relationship of the connection between the bits of the counter output and Delay-Cells, which is shown in FIG. 1, but the invention is not limited thereto. In other words, it is sufficient that plural Delay-Cells controlled by the output from the most significant bit (MSB) among plural bits output from the counter are placed at alternate positions in the serial connection of the Delay-Cells. More preferably in the arrangement, one Delay-Cell corresponding to the least significant bit (LSB) from the counter is placed at the center position in the alternate empty spaces excluding the alternate positions of the Delay-Cells corresponding to the MSB.

Configuration of DLL According to Second Embodiment

Figure 2:
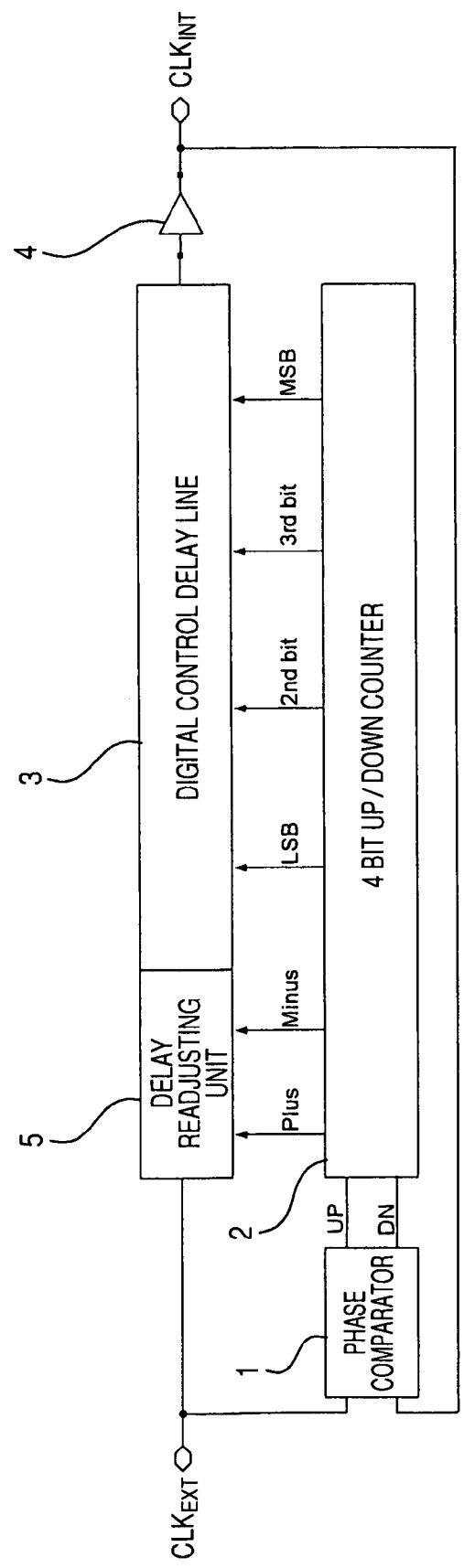
FIG. 2 is a block diagram illustrating an example of a digital DLL according to a second embodiment.

FIG. 2 is a block diagram illustrating an example of a digital DLL according to a second embodiment. The DLL according to the second embodiment is similar to that of the first embodiment, which has been described above, in that it includes a phase comparator 1 detecting a phase difference between an external clock and an internal clock phase, a counter 2 controlling a delay time in accordance with output signals UP and DN from the comparator 1, a digital control delay line 3 adjusting a delay time, and a clock driver 4. However, they are different in that the DLL according to the second embodiment further includes a delay readjusting unit 5 to be controlled by output signals Plus and Minus from the counter 2 on the input side of the digital control delay line 3.

The digital control delay line 3, which is a main part of the DLL of this embodiment is similar to that of the first embodiment, and the Delay-Cells controlled by the output from a same bit in the output from the counter are not placed adjacently to each other in the connection of plural Delay-Cells.

More specifically, plural Delay-Cell controlled by the output from the most significant bit (MSB) among plural bits output from the counter are placed at alternate positions in the serial connection of the Delay-Cells (refer to FIG. 1).

Furthermore, in the arrangement of the Delay-Cell at alternate positions in accordance with the MSB as described above, one Delay-Cell corresponding to the least significant bit (LSB) from the counter at the center position in the alternate empty spaces excluding the alternate positions (refer to FIG. 1).

Thus, like the first embodiment, even when the MSB of the counter output changes from "0" to "1" with the addition of one delay, signals do not pass Delay-Cells at the OFF-state consecutively. Therefore, the instable state ends in a short time.

In the second embodiment, the counter and differential delay adjusting unit, which will be described later, can provide the configuration of a DLL circuit, which is small in size but has a wide lock range even when the amount of delay exceeds the adjustable amount in the delay line.

Figure 3:
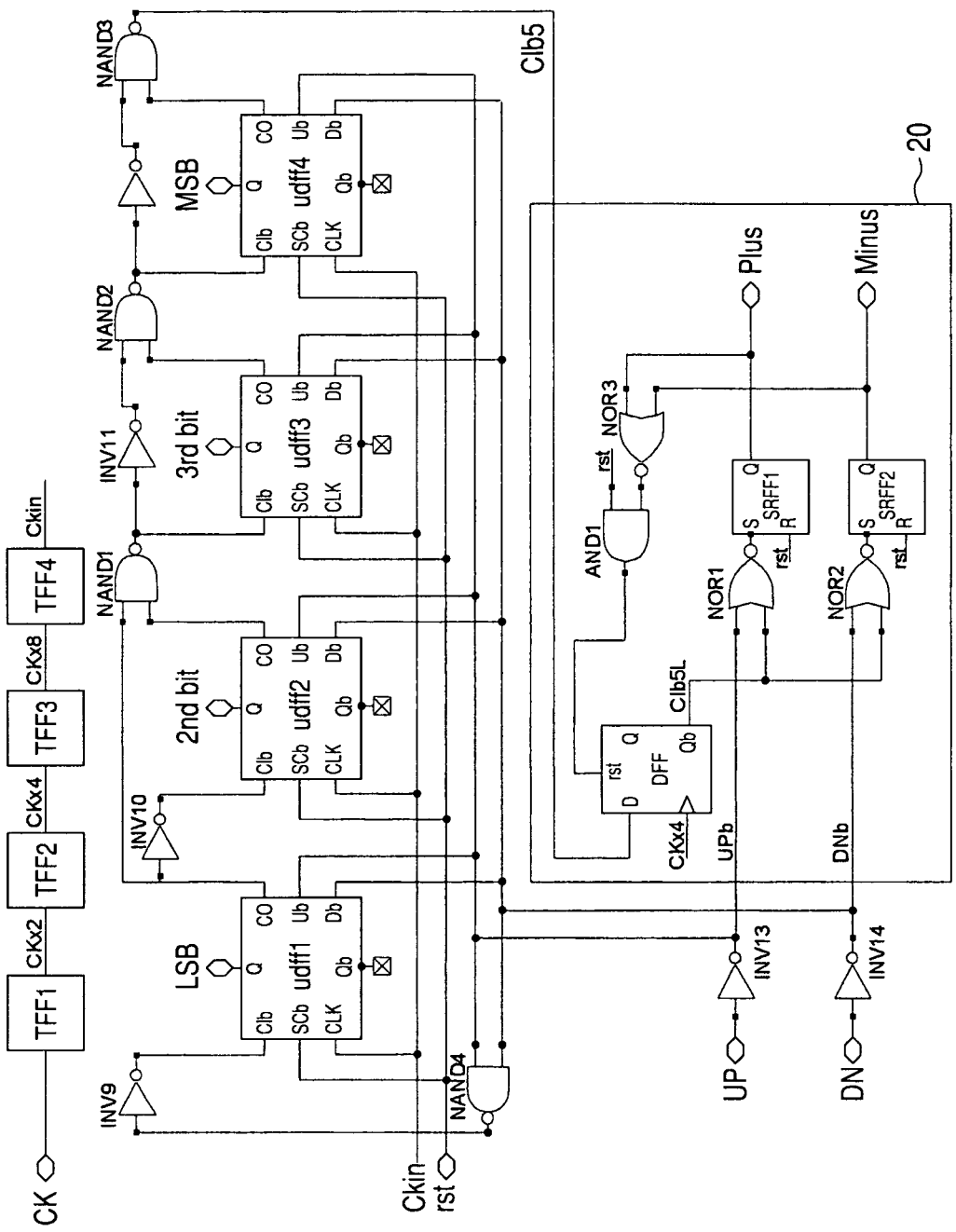
FIG. 3 is a circuit diagram illustrating an example of a counter according to the second embodiment.
Figure 4:
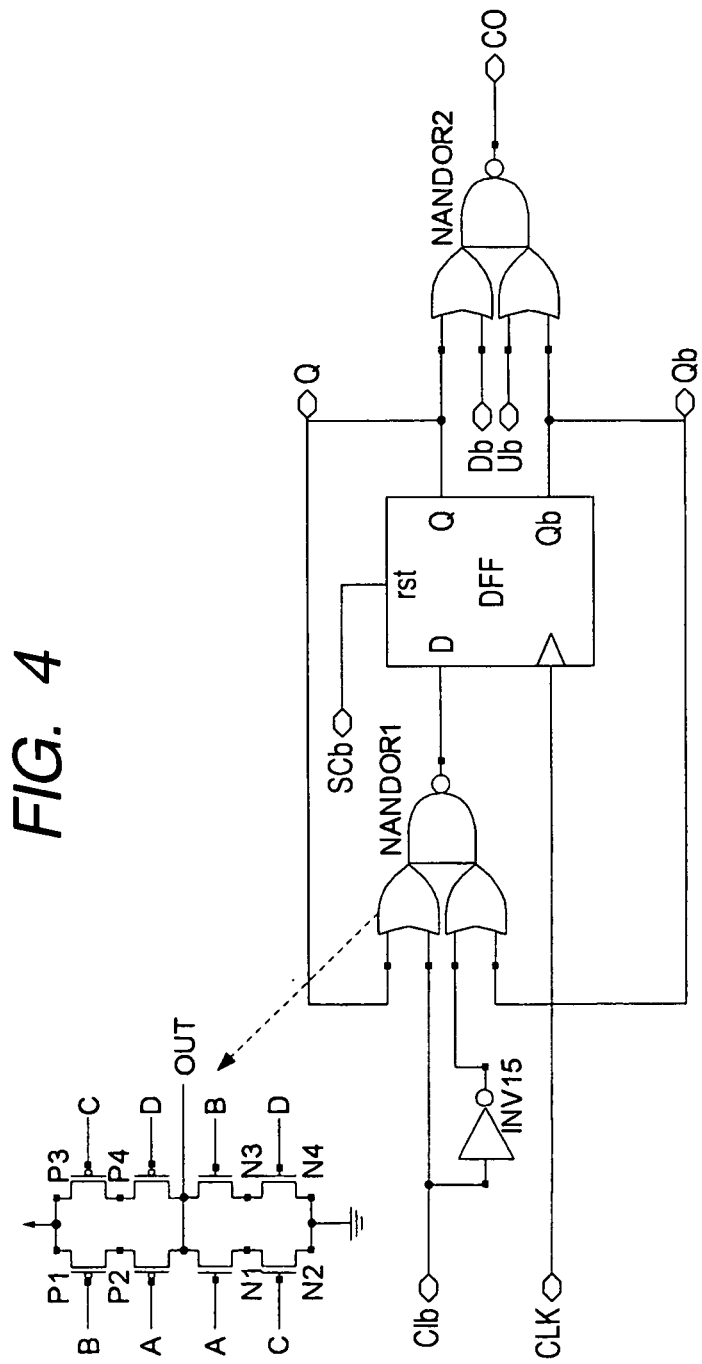
FIG. 4 is a circuit diagram illustrating an example of an up/down flip-flop.

FIG. 3 is a circuit diagram illustrating an example of a counter according to the second embodiment. The counter is operated with a clock CKin resulting from the several divisions of a master clock CK for stable operations. Though using TFFs 1 to 4 in the example shown in FIG. 3, the number of frequency division is not particularly limited. The main components are up/down flip-flops (which will be called "udff" hereinafter) 1 to 4, and an example of the circuit diagram thereof is shown in FIG. 4.

Each of The udffs includes an inverter INV15, complex gates NANDOR1 and NANDOR2 each including P-channel transistors P1 to P4 and N-channel transistors N1 to N4 and a D-type flip-flop DFF. Each of the udffs in the circuit configuration switches the carry signal CO to the next udff to either positive fanout Q or negative fanout Qb of the DFF, which can switch the count up/down operations, in accordance with the polarities of the count up signal UP and the count down signal DN.

The counter employed in the second embodiment is characterized by including the added circuit shown in FIG. 3. An added circuit 20 includes a D-type flip-flop DFF, NORs 1 to 3, AND 1 and set/reset flip-flops (which will be called "SRFFs" hereinafter) 1 and 2. The added circuit receives a signal Cib5 resulting from the decoding of all carry-out signals CO from all of the udffs included in the counter as the input signal. The added circuit further receives signals UPb and DNb resulting from the inversion of the count up/down signals UP and DN by the inverters INV13 and INV14 as the input signal.

Figure 5:
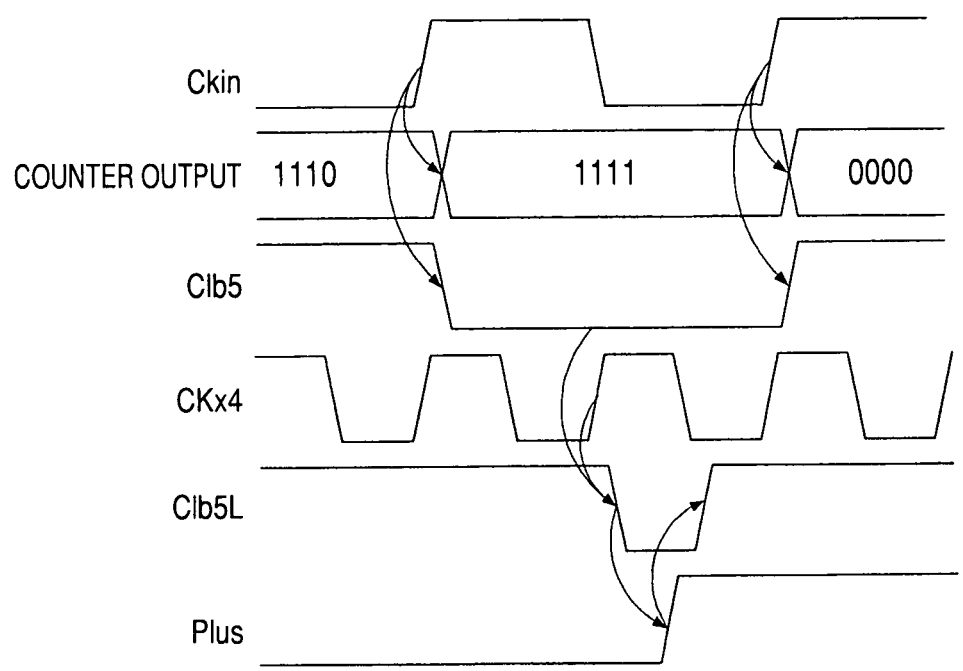
FIG. 5 is a diagram showing operation waveforms of an added circuit.

Next, operations will be described with reference to the operation waveform of the added circuit shown in FIG. 5. Notably, assuming a case where a count up operation is performed in synchronization with the counter clock CKin in FIG. 5, similar operations are performed in counting down.

First of all, if counting up continues and all of the counter outputs reach the "H" level 1111, the overflow signal CIb5 comes to have the "L" level. The DFF captures the change in signal CIb5 in synchronization with a clock CKx4, which is at a faster cycle than that of the counter clock CKin. In this case, because the signal UPb has the "L" level if it is during the count up operation, data is set to the SRFF 1, and a signal Plus comes to have the "H" level.

Conversely, because the signal DNb has the "L" level if it is during the count down operation, data is set to the SRFF 2, and a signal Minus comes to have the "H" level. The "H" level of the Plus/Minus signal resets the DFF through the AND 1 and NOR 3 to prepare for the next operation. The "L" level of the system reset signal rst resets the DFF and the SRFFs 1 and 2.

In other words, even if the counter reaches full count, that is, even if the amount of delay exceeds the amount of delay adjustable in the delay line but no lock points are found yet, the added circuit 20 operates to output the signal Plus/Minus.

Figure 6:
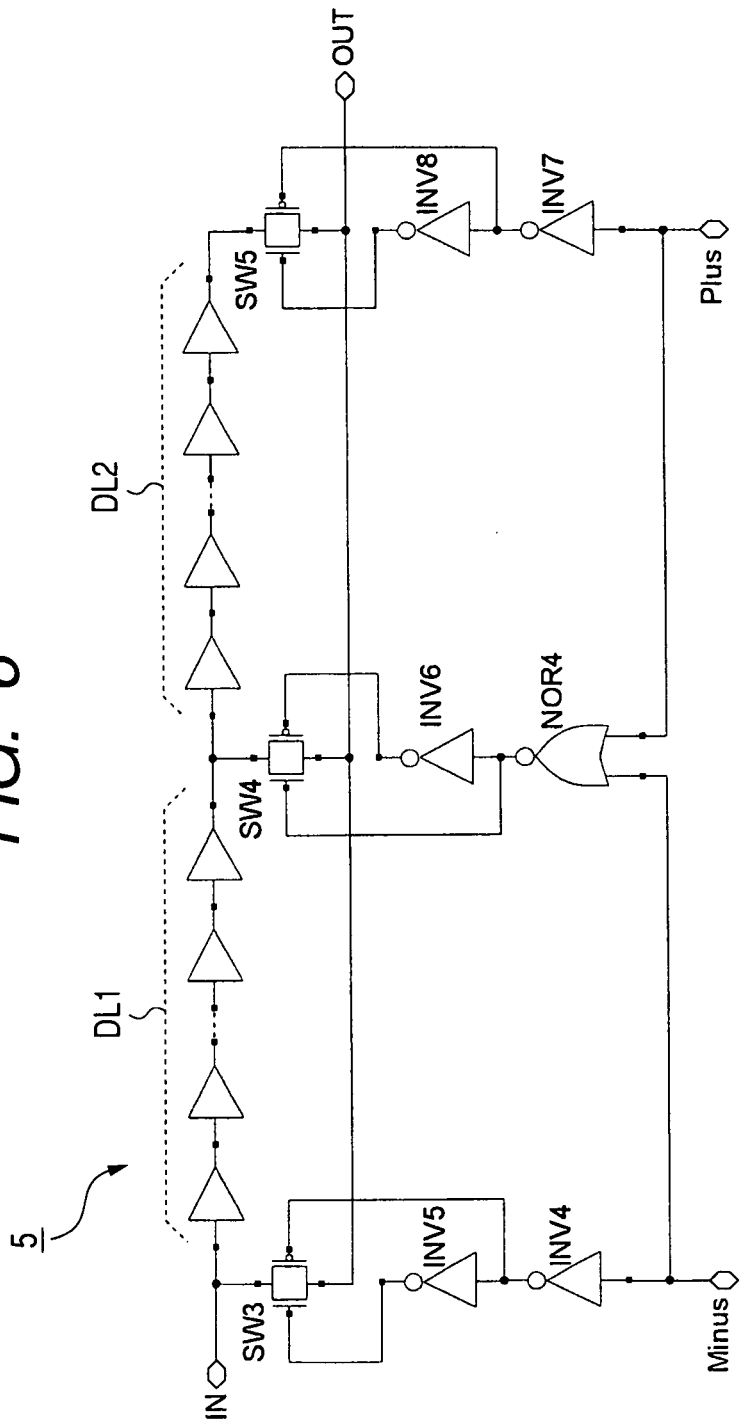
FIG. 6 is a circuit diagram illustrating an example of a delay readjusting unit controlled by the signal Plus/Minus.

FIG. 6 is a circuit diagram illustrating an example of the delay readjusting unit controlled by the signal Plus/Minus. The delay readjusting unit 5 includes delay lines DL1 and DL2 including several buffers, switches SW1 to SW3, inverters INV4 to INV8 and a NOR4.

In a normally operation of the delay readjusting unit 5, the SW4 opens because both signals Plus and Minus have the "L" level, and the input signal IN passes through the delay line DL1 and is output as the output signal OUT.

Next, if the signal Minus input to the delay readjusting unit 5 has the "H" level, the SW3 opens. Therefore, the input signal IN is directly output as the output signal OUT. On the other hand, if the signal Plus input to the delay readjusting unit 5 has the "H" level, the SW4 opens. Therefore, the input signal IN passes through the delay line DL1 and DL2 and is output as the output signal OUT.

In other words, if the amount of delay under a normal operation state exceeds the amount of delay adjustable in the delay line, the amount of delay in the delay line DL1 can be further reduced if it is during the count down operation, that is, in order to advance the phase of internally generated clocks. Conversely, the amount of delay in the delay line DL2 can be further increased if it is during the count up operation, that is, in order to delay the phase of internally generated clocks. After performing the readjustments, detail phase adjustment is restarted in the phase comparator 1, counter 2 and digital control delay line 3 shown in FIG. 2.

In the DLL according to the second embodiment, the buffer size and the number of the buffers are defined such that a delay can be adjusted greatly in the delay lines DL1 and DL2 in the delay readjusting unit and such that the delay adjustment in detail steps can be allowed in the delay line. Therefore, a DLL circuit in a small size but with a wide lock range in both control circuit and delay line can be configured.

Display Apparatus

Figure 7A:
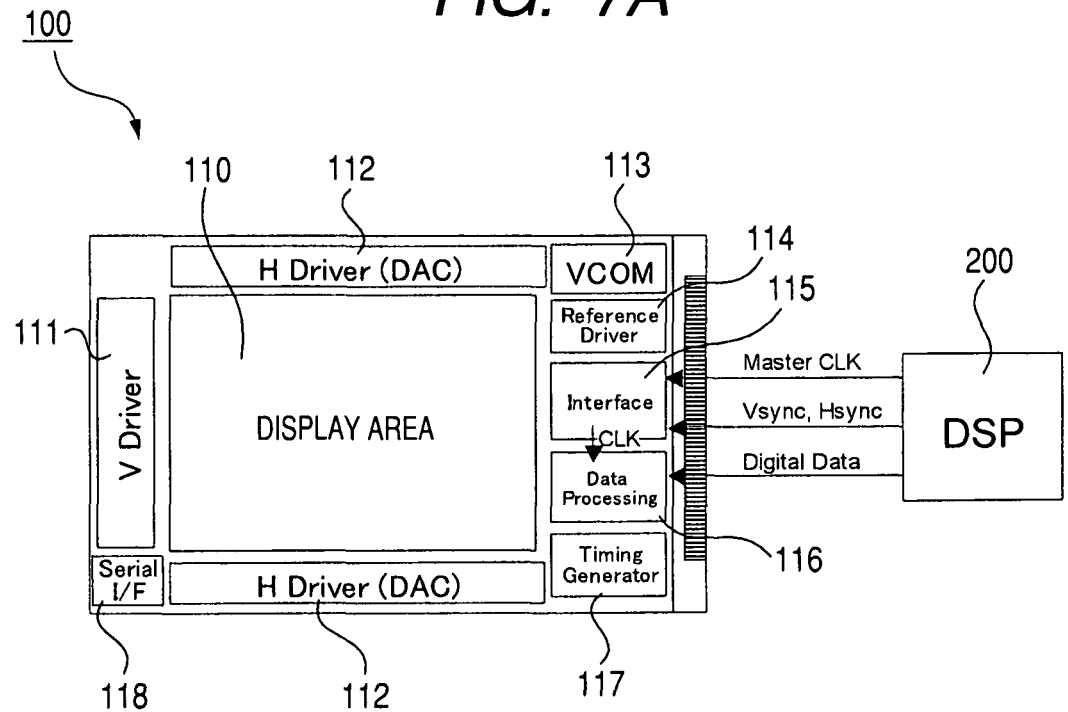
FIGS. 7A and 7B is a block diagram illustrating a configuration example of a display apparatus employing the DLL according to the embodiment.
Figure 7B:
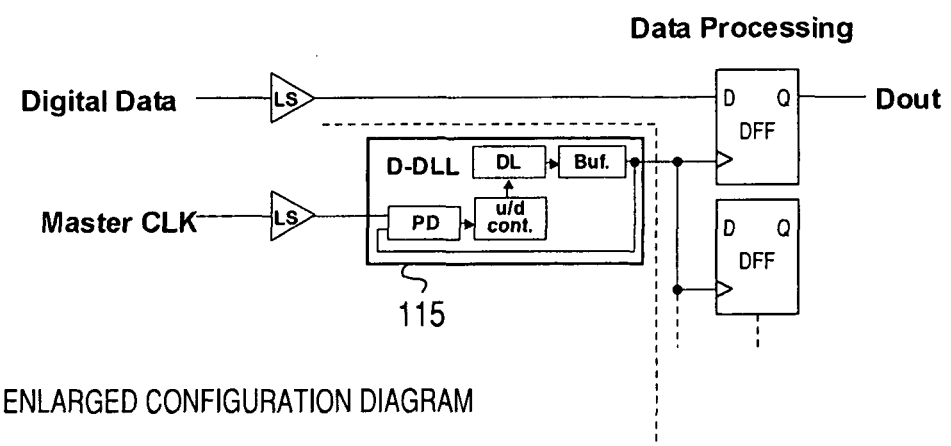

FIG. 7 is a block diagram illustrating a configuration example of a display apparatus employing the DLL according to this embodiment. A display apparatus 100 includes a display area 101 at the center having plural pixels in a matrix form and includes, around the display area 101, a vertical driver 111, a horizontal driver 112, a common electrode 113, a reference driver 114, an interface circuit 115, a data processing circuit 116, a timing generating circuit 117, and a serial interface circuit 118.

The display apparatus 100 receives the supply of a master clock (Master CLK), a vertical synchronizing signal (Vsync), a horizontal synchronizing signal (Hsync) and digital data (which is image data) from an external digital signal processing circuit 200, drives the surrounding circuits on the basis of the signals and displays an image on the display area 110.

The DLL of this embodiment may be mounted in the interface circuit 115 and correct the phase shift between the master clock (Master CLK) transmitted from the external digital signal processing circuit 200 and an internally generated clock. In other words, a phase shift may occur between the master clock (Master CLK) and an internal clock due to the level shift or driving within the display apparatus 100, and the phase shift is corrected by the DLL of this embodiment. The corrected clock is input to the data processing circuit 116, resulting in highly accurate data sampling.

Effects of Embodiments

[1] The bit outputs from the counter 2 are connected to the plural Delay-Cells included in a digital control delay line controlled by an up/down counter alternately, that is, in the arrangement that the Delay-Cells controlled by the output from a same bit are not adjacent to each other in the digital control delay line. This can eliminate the instable period due to the switching of the output bits of the counter.

[2] If the counter reaches full count, that is, if the amount of delay exceeds the amount of delay adjustable in the delay line but no lock points are found yet, the addition of means for outputting signals Plus/Minus indicating either further delay or advance by using the overflow signal and count up/down signal of the counter. This can prevent the delay for the added control circuit and can increase the lock range.

[3] Providing the delay readjusting unit which includes three switches for switching among two delay lines and output on the input side of the digital control delay line allows the switching among three states of (1) the normal state, (2) the case where the amount of delay exceeds the amount of delay adjustable in the digital control delay line, which may require further delay, and (3) the case which may require further advance therefor. This can prevent the increase in size of the delay line but can increase the lock range.

It should be understood by those skilled in the art that various modifications, combinations, sub-combinations and alterations may occur depending on design requirements and other factors insofar as they are within the scope of the appended claims or the equivalents thereof.

What is claimed is:

1. A delay locked-loop circuit comprising:
   delay cells configured to delay an external clock by a delay time, said external clock upon delay becoming an internal clock;
   a comparator configured to detect a phase difference between said external clock and said internal clock, output signals from said comparator controlling a counter;
   bit lines from said counter to said delay cells, signals on said bit lines controlling said delay time,
   wherein one of the bit lines is connected to non-adjacent ones of the delay cells, none of the bit lines being connected to adjacent ones of the delay cells.

2. The delay locked-loop circuit according to claim 1, wherein one of the delay cells is connected in series with another of the delay cells.

3. The delay locked-loop circuit according to claim 1, wherein a signal on said one of the bit lines is the most significant bit of said counter.

4. The delay locked-loop circuit according to claim 1, wherein said output signals are count up/down signals.

5. A display apparatus comprising:
   a display unit, a display timing of said display unit being controlled by the internal clock of claim 1.

* * * * *